US010885952B1

(12) United States Patent
Brahmadathan et al.

(10) Patent No.: US 10,885,952 B1
(45) Date of Patent: Jan. 5, 2021

(54) MEMORY DATA TRANSFER AND SWITCHING SEQUENCE

(71) Applicant: Cadence Design Systems, Inc., San Jose, CA (US)

(72) Inventors: Sandeep Brahmadathan, Dublin, CA (US); Takashi Ueda, Cupertino, CA (US); Jeffrey S. Earl, San Jose, CA (US); Utpal Mahanta, Milpitas, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/727,623

(22) Filed: Dec. 26, 2019

(51) Int. Cl.
 G11C 8/00 (2006.01)
 G11C 7/10 (2006.01)
 G11C 7/22 (2006.01)
 G06F 13/16 (2006.01)

(52) U.S. Cl.
 CPC ........ *G11C 7/1072* (2013.01); *G06F 13/1689* (2013.01); *G11C 7/1066* (2013.01); *G11C 7/1093* (2013.01); *G11C 7/222* (2013.01)

(58) Field of Classification Search
 CPC ....... G11C 8/00; G11C 7/1072; G11C 7/1066; G11C 7/1093; G11C 7/222; G06F 13/1689

USPC ....................................................... 365/233.1
See application file for complete search history.

(56) References Cited

U.S. PATENT DOCUMENTS

| 6,975,557 | B2* | 12/2005 | D'Luna | ............... | G06F 13/4243 365/193 |
| 7,333,390 | B2* | 2/2008 | D'Luna | ............... | G06F 13/4243 327/156 |
| 7,515,504 | B2* | 4/2009 | D'Luna | ............... | G06F 13/4243 365/193 |
| 9,432,298 | B1* | 8/2016 | Smith | ................. | H04L 49/9057 |
| 2005/0073902 | A1* | 4/2005 | D'Luna | .................. | G11C 29/02 365/233.1 |
| 2006/0077752 | A1* | 4/2006 | D'Luna | ................. | H03L 7/0812 365/233.11 |
| 2008/0101526 | A1* | 5/2008 | D'Luna | .................... | G11C 7/22 375/376 |

\* cited by examiner

*Primary Examiner* — Harry W Byrne
(74) *Attorney, Agent, or Firm* — Schwegman Lundberg & Woessner, P.A.

(57) ABSTRACT

Various embodiments described herein provide for a data transfer mechanism for a memory device, such as a Double Data Rate (DDR) memory device, which can improve critical timing within the memory device without a latency impact. In addition, various embodiments described herein provide for a switching sequence for a memory device, which can improve switching time for the memory device.

20 Claims, 11 Drawing Sheets

MEMORY DATA TRANSFER AND SWITCHING SEQUENCE

TECHNICAL FIELD

Embodiments described herein relate to memory and, more particularly, to data transfer and a switching sequence for a memory device, such as a Double Data Rate (DDR) Dynamic Random-Access Memory (DRAM) or a Single Data Rate (SDR) Dynamic Random-Access Memory (DRAM) memory device.

BACKGROUND

For certain memory systems, such as those based on Double Data Rate (DDR) or a Single Data Rate (SDR) Dynamic Random-Access Memory (DRAM), signals are often delayed as a percentage of the clock signal period (e.g., shift a signal by 25% of a clock period). Conventionally, this can be achieved by passing a clock signal though a delay line and using this delayed clock signal to sample and send the signal to be delayed, thereby generating the desired delay signal.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
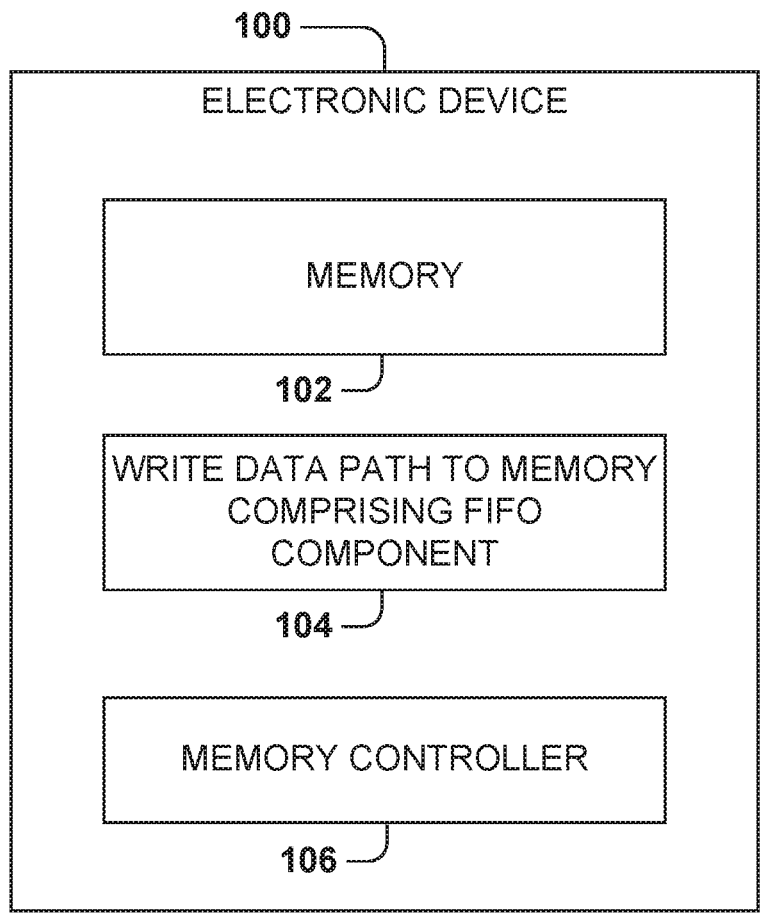
FIG. 1 is a block diagram illustrating an example electronic device that comprises an example write data path to memory, in accordance with various embodiments.

As previously noted, in certain memory systems, signals are delayed as a percentage of the initial clock signal period (e.g., shift a signal by 25% of a clock period). This can pose a problem for conventional memory devices (e.g., conventional DDR memory device), since, as the operating speed of the memory device increases, the timing margins decrease for transferring a signal from a pre-delayed clock signal to a post-delayed clock signal. For instance, for a conventional memory device, the transfer from a pre-delay line to a post-delay line can provide a timing margin of ½ clock cycle for setup and hold, which can cause a setup and hold time conflict/collision (e.g., at frequencies of 4.4 GHz and higher). Additionally, to prevent glitches in the output of a physical layer (PRY) when changing a delay setting programmed to the delay line (e.g., when moving from one rank access to another in a DRAM system, also referred to herein as rank-to-rank switching), it is common to wait a few clock cycles before a stable clock output is achieved by the conventional physical layer (PRY). This can be due to delay lines being typically made up of gates (e.g., NAND gates) and being susceptible to glitches when the delay setting value changes. The clock cycle wait can result in a time latency for accessing the conventional memory device, which can be critical for some memory applications.

Various embodiments described herein provide for a data transfer mechanism for a memory device, such as a Double Data Rate (DDR) memory device (e.g., DDR3, LPDDR3, DDR4, LPDDR4, or LPDDR5 DRAM) or a or a Single Data Rate (SDR) memory device, which can improve critical timing within the memory device without a latency impact. For instance, some embodiments described herein provide improved pre-delay line to post-delay line transfer timing margin (e.g., for physical design implementation) without compromising latency. Some embodiments can lower latency with respect to a memory device. In addition, various embodiments described herein provide for a switching sequence for a memory device, which can improve switching time for the memory device. For instance, some embodiments described herein provide glitch-less delay line switching that reduces rank-to-rank switch time, which can improve memory device bandwidth. Depending on the embodiment, both the data transfer mechanism and the switching sequence described herein can be implemented with respect to a single memory device, thereby providing the single memory device with the benefits of both. Embodiments described herein can be implemented, for example, with respect to a memory device that can operate at a high speed (e.g., at frequencies of 4.4 GHz or higher).

According to some embodiments, a write data path (also referred to as a data write path) coupled to a memory is provided, where the write data path comprises a first-in-first-out (FIFO) component (e.g., FIFO-based mechanism), which can increase the setup time of a write path inside a physical layer (PHY) of a device communicating with the memory (e.g., to 0.5 tCK [Time Clock period] for a DDR memory device) and hold time (e.g., >1 tCK for a DDR memory device, such as 2 times tCK), and can resolve the setup time/hold time collision with no compromise to latency. For some embodiments, the write data path comprises a digital delay line to facilitate operations of the write data path. Additionally, for some embodiments, the write data path comprises a write pointer generator (to generate a write pointer signal) and a read pointer generator (to generate a read pointer signal) to facilitate operation of the FIFO component in the write data path.

When changing a digital delay line setting in the write data path, or when synchronizing the write pointer signal and the read pointer signal, some embodiments can stop (e.g., gate) a clock going into a digital delay line. For example, the clock signal going into the digital delay can be stopped (e.g., for one or more clock cycles) and then a pre-delayed clock signal can be used to synchronize the write pointer signal and the read pointer signal. The synchronization between the write pointer signal and the read pointer signal can ensure that those signals are aligned, which in turn can enable alignment of signals across the physical layer (PHY) communicating with the memory device. In another example, the clock signal going into the digital delay can be stopped (e.g., for one or more clock cycles) and a sequence can be performed for changing a digital delay line setting, such as switching the digital delay line from a first delay value to a second delay value. In doing so, various embodiments can reduce or avoid glitches when switching a digital delay line, and can reduce having to halt data transfer to implement a digital delay line change.

With respect to a DDR memory device or DDR memory system, various embodiments described herein can improve critical timing from a pre-delay line clock signal to a post-delay line clock signal without compromising latency, can improve rank-to-rank switch time, or can do both. Though various embodiments are described herein with respect to DDR memory devices/systems, some embodiments can apply to any memory type that uses delayed signaling in its write data path. Additionally, though various embodiments are described herein with respect to a DDR memory device, some embodiments can be implemented with respect to a SDR memory device to achieve similar benefits.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a block diagram illustrating an example electronic device 100 that comprises an example write data path 104 to memory 102, in accordance with various embodiments. The electronic device 100 may comprise any electronic device that uses a memory and a processor, such as a central processor unit (CPU) or a graphics processing unit (GPU). For instance, the electronic device 100 may comprise, without limitation, a computer (e.g., a server computer, a client computer, a personal computer (PC), a tablet computer, a laptop computer, a netbook), a set-top box (STB), a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any electronic device capable of executing instructions with respect to a memory.

As shown, the electronic device 100 includes a memory 102, the write data path 104 to the memory 102, and a memory controller 106. According to various embodiments, the write data path 104 comprises a first-in-first-out component as described herein. Any one or more of the components described may be implemented using hardware alone or a combination of hardware and software. Moreover, any two or more components of the electronic device 100 may be combined into a single component, and the functions described herein for a single component may be subdivided among multiple components.

To avoid obscuring illustrated embodiments with unnecessary detail, various functional components (e.g., modules) that are not germane to conveying an understanding of the illustrated embodiments may have been omitted from the figures described herein. Various additional functional components may be supported by the electronic device 100 to facilitate additional functionality that is not specifically described herein.

The memory 102 comprises one or more memory cells or memory devices, each of which may comprise some form of random access memory (RAM), such as Dynamic Random-Access Memory (DRAM) or Static Random-Access Memory (SRAM). Though illustrated as a separate component, for some embodiments, the write data path 104 can form part of the memory 102. For some embodiments, the memory 102 comprises Double Data Rate (DDR) Dynamic Random-Access Memory (DRAM), such as Double Data Rate 3 (DDR3), Double Data Rate 4 (DDR4), Low Power Double Data Rate 3 (LPDDR3), and Low Power Double Data Rate 4 (LPDDR4), and Low Power Double Data Rate 5 (LPDDR5).

Though not illustrated, the electronic device 100 includes a physical layer (PRY), which can comprise one or more electronic signal paths (e.g., individual lines coupling pins of the memory 102 and the memory controller 106 such that data, address, command, protocol, control, clock, and other information can be carried between the memory 102 and the memory controller 106 as electronic signals. The PHY can comprise an interconnect, such as a link or a bus. Among the electronic signals carried, the PRY can carry one or more data signals for data to be written to, or read from, the memory 102 (e.g., a memory cell of the memory 102). Additionally, the PHY can carry one or more signals, which can facilitate writing data to, or reading data from, the memory 102 (e.g., a memory cell of the memory 102). The PRY can further comprise a memory socket, such as a SIMM or DIMM socket, configured to connect to a particular memory module package. For some embodiments, the write data path 104 forms part of the PHY.

The memory controller 106 manages exchange of data to and from the memory 102. To facilitate this, the memory controller 106 can exchange data, address, command, protocol, control, clock, and other information with the memory 102 over the write data path 104. For some embodiments, the write data path 104 facilitates exchange of data to be written to the memory 102.

For various embodiments, the write data path 104 couples the memory controller 106 to the memory 102. According to some embodiments, the write data path 104 comprises a first-in-first-out (FIFO) component that implements a FIFO data storage structure within the write data path. For some embodiments, the write data path 104 receives input data (e.g., provided via a memory DQ signal) to be written to the memory 102 for storage. The input data can comprise two data bits per a clock cycle. Additionally, the write data path 104 can receive an input clock signal, where the input clock signal can comprise a system clock signal (e.g., clock signal provided by a PHY).

For various embodiments, the FIFO component of the write data path 104 receives the input clock signal, a write pointer signal, a read pointer signal, and the input data to be written to the memory 102. The FIFO component can store the input data to the FIFO data storage structure based on the write pointer signal and the input clock signal, and the FIFO component can output data (e.g., first intermediate data) from the FIFO data storage structure based on the read pointer signal and the input clock signal.

For some embodiments, the write data path 104 comprises a digital delay line (DDL) component that receives the input clock signal and generates a write clock signal based on the input clock signal. For instance, the digital delay line component can generate the write clock signal based on one or more settings (e.g., delay values) applied to the digital delay line component. The digital delay line component, for example, can generate the write clock signal by applying one or more delays to the input clock signal based on the one or more delay values. The input clock signal can represent a pre-digital delay line (DDL) clock signal. The write clock signal can represent a post-digital delay line (DDL) clock signal, which can facilitate write operations with respect to the memory 102 based on a memory protocol. The FIFO component of the write data path 104 can transfer the input data from the domain of the input clock signal to the domain of the write clock signal.

For some embodiments, the write data path 104 comprises a write pointer generator that receives the input clock signal and generates the write pointer signal for the FIFO component, and a read pointer generator that receives the write clock signal (from the digital delay line component) and generates the read pointer signal for the FIFO component.

For some embodiments, the write data path 104 comprises a plurality of flip-ops and a multiplexer, which combined can generate write data to the memory 102 for data storage. The write data can comprise a serialized data bit stream, which may be adapted for communication with the memory 102 at a dual-data rate (DDR). The plurality of flip-flops can receive the write clock signal (from the digital delay line component), receive data (e.g., first intermediate data) from the FIFO component, and output data (e.g., second intermediate data) based on the data from the FIFO component and the write clock signal from the digital delay line component. The multiplexer can receive the data (e.g., second intermediate data) from the plurality of flip-flops and output write to the memory 102 based on the received data and the write clock signal from the digital delay line component.

For some embodiments, the write data path 104 comprises a clock control component to stop the input clock signal from being received by the digital delay line component during at least one of application of a setting change to the digital delay line component or synchronization of the write pointer signal and the read pointer signal. For some embodiments, the clock control component comprises at least one clock gate to stop the input clock signal from being received by the digital delay line component. Alternatively (or additionally), for some embodiments, the clock control component comprises a clock divider that can receive an input clock signal at multiple speed (e.g., clock rate at twice the rate) and divide the input clock signal such that the input clock signal is stopped for a desired number of clock cycles. Depending on the embodiment, the clock control component can stop the input clock signal for at least one clock cycle (e.g., two clock cycle for DDR3 or DDR4 memory). The synchronization of the write pointer signal and the read pointer signal can comprise, for example, causing the clock control component to stop the input clock signal from being received by the digital delay line component for at least one clock cycle. During the at least one clock cycle, the input clock signal can be sent to the read pointer generator, and in the absence of the write clock signal from the digital delay line component (or in response to the write clock signal not being sent to the read pointer generator), the read pointer generator can generate the read pointer signal based on the input clock signal. In doing so, the write pointer signal and the read pointer signal can be synchronized.

The setting change to the digital delay line component can comprise, for example, causing the clock control component to stop the input clock signal from being received by the digital delay line component for at least one clock cycle. During the at least one clock cycle, the digital delay line component can switch from a first delay value to a second delay value.

More regarding some embodiments of the write data path 104 is described below with respect to the other figures described herein.

Figure 2:
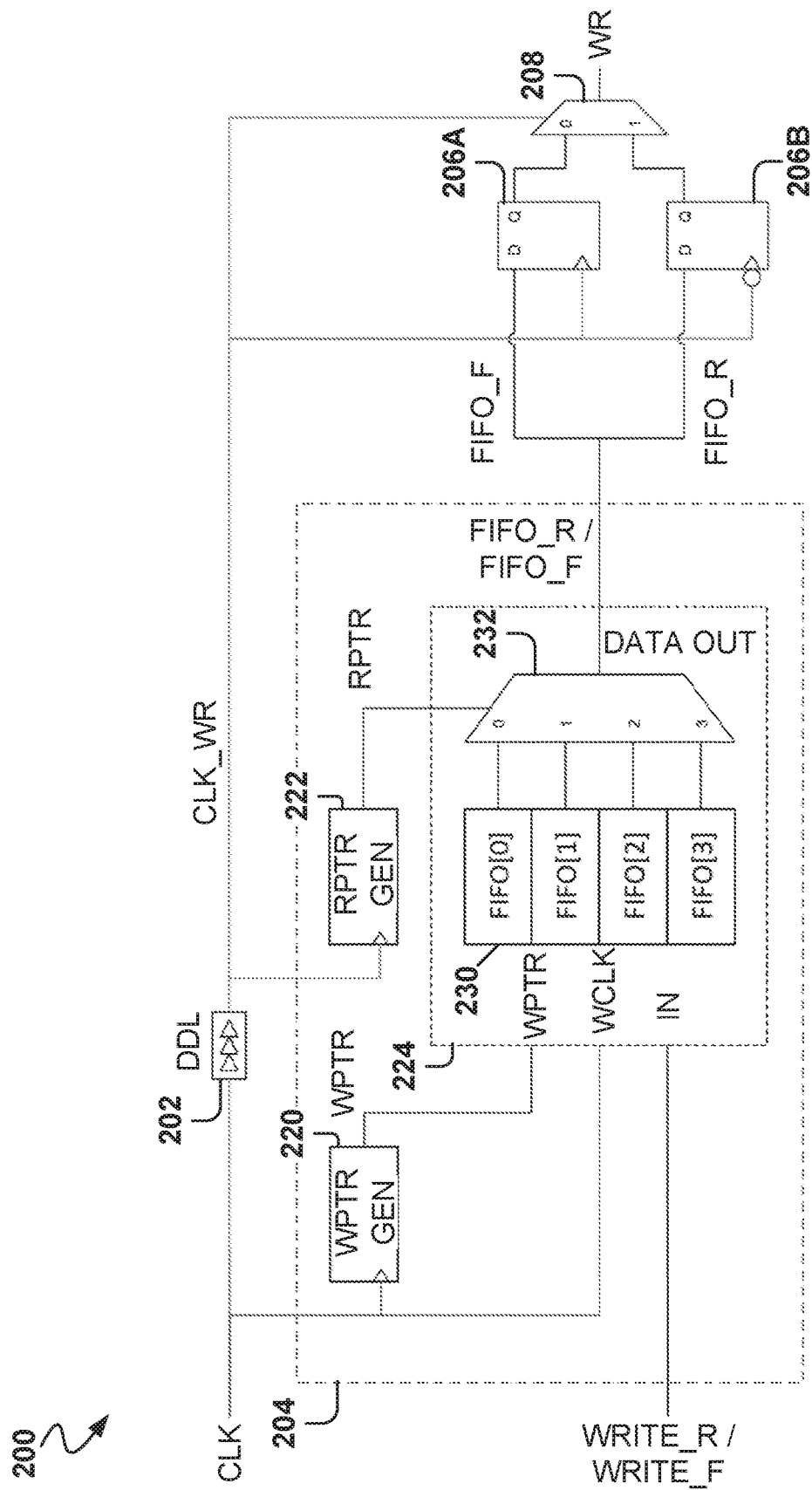
FIGS. 2 through 4 are circuit schematics illustrating example write data paths each comprising a first-in-first-out (FIFO) component, in accordance with various embodiments.
Figure 3:
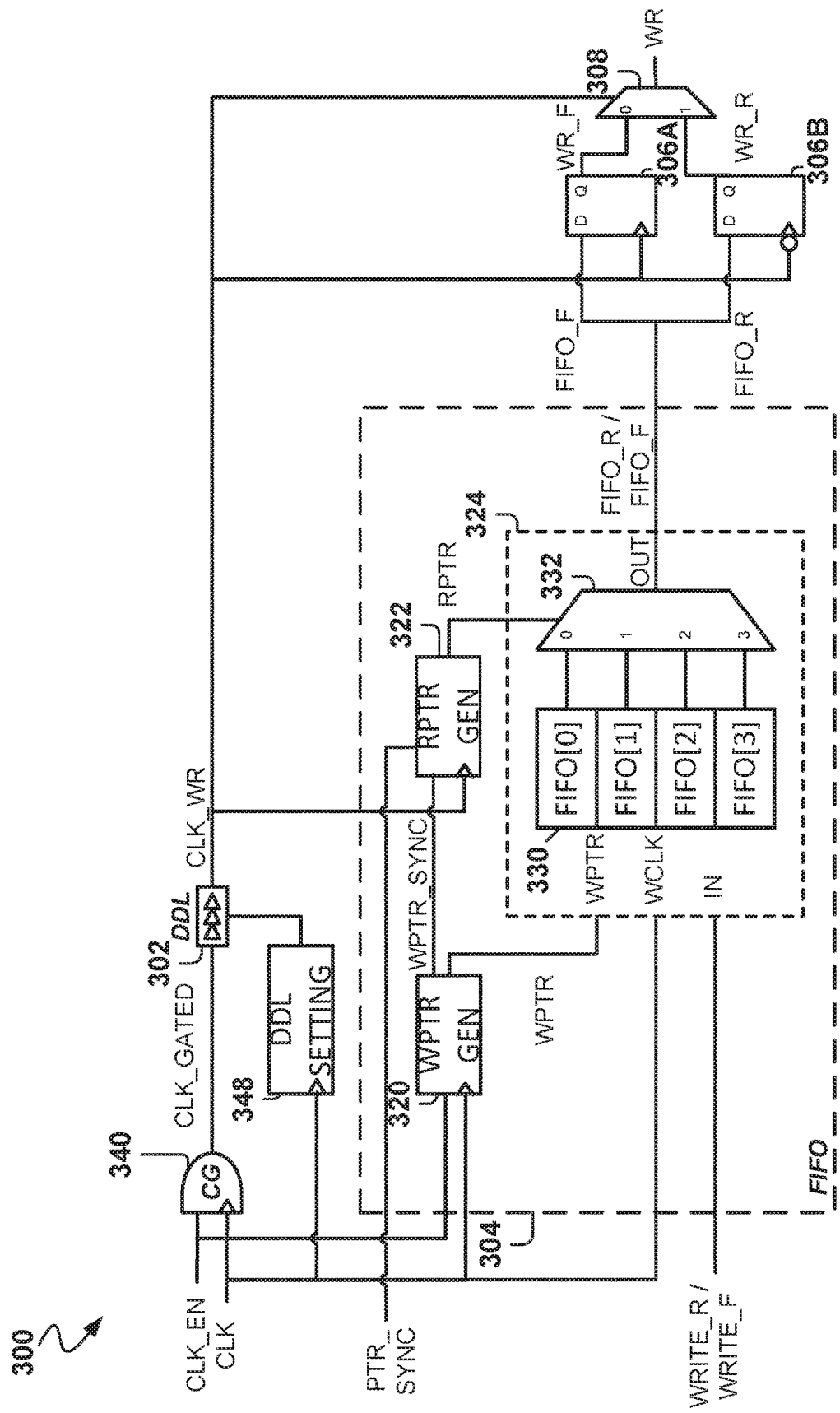
Figure 4:
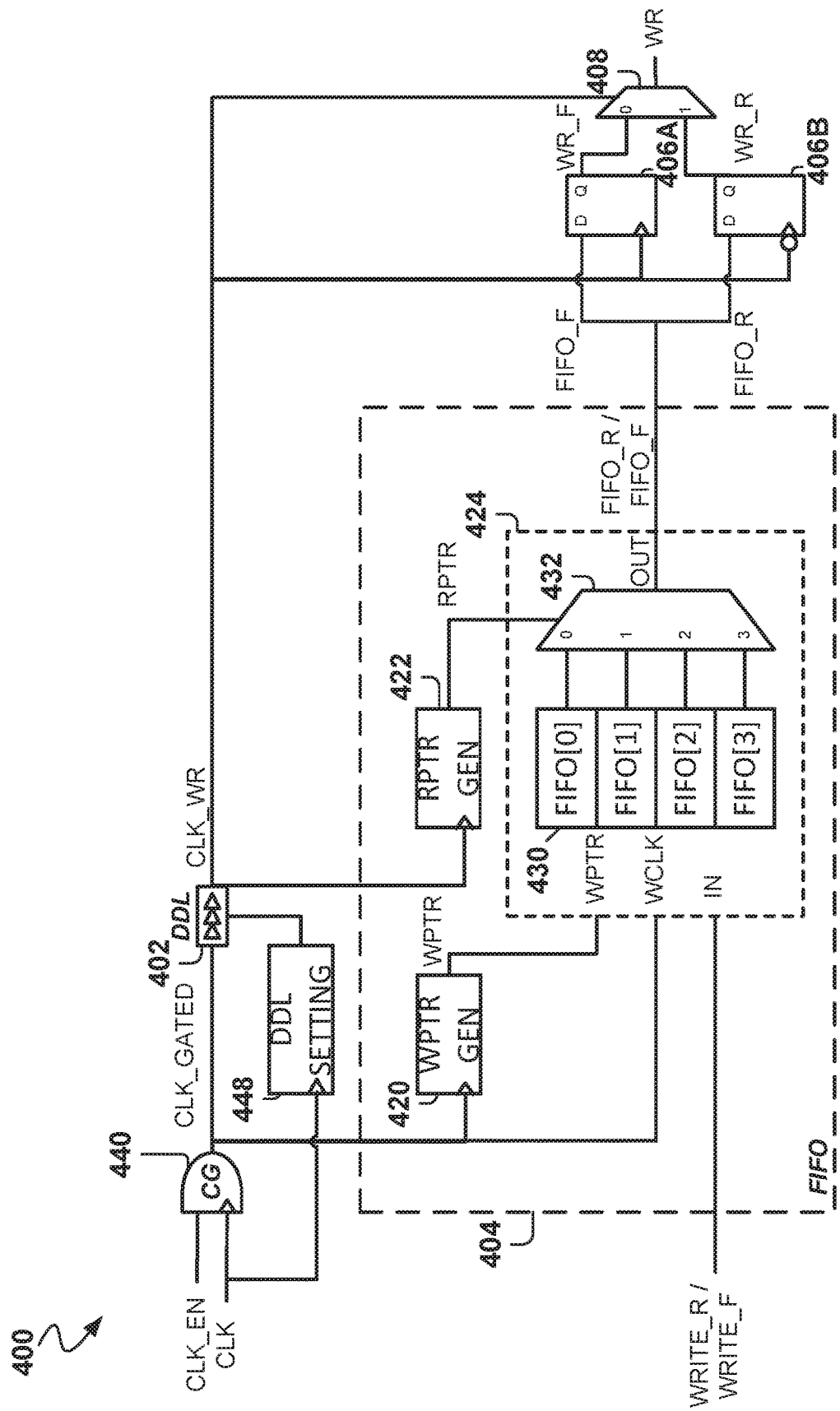

FIGS. 2 through 4 are circuit schematics illustrating example write data paths 200, 300, 400 each comprising a first-in-first-out (FIFO) component, in accordance with various embodiments. For various embodiments, the components and arrangement of components may vary from what is illustrated in FIGS. 2, 3, and 4. For instance, the write data path 200 can include more or fewer components than the components shown in the FIG. 2.

With reference to FIG. 2, the write path 200 illustrates how some embodiments pass data from one clock domain to another. The write path 200 as illustrated includes a digital delay line (DDL) component, a first-in-first-out (FIFO) mechanism, and DDR generation, but does not include clock gating. In particular, the write data path 200 comprises a DDL component 202, a FIFO mechanism 204, flip-flops 206A, 206B, and a multiplexer 208, where the first-in-first-out mechanism 204 comprises a write pointer generator (WPTR GEN) 220, a read pointer generator (RPTR GEN) 222, and a first-in-first-out (FIFO) component 224. The FIFO component 224 comprises a first-in-first-out (FIFO) data storage structure 230 that couples to a multiplexer 232 that outputs data from the FIFO data storage structure 230 to each of the flip-flops 206A, 206B.

As shown, the DDL component 202, the write pointer generator 220, and the FIFO component 224 are each coupled to a component that provides an input clock signal (CLK). The DDL component 202 is coupled to the read pointer generator 222, the flip-flops 206A, 206B, and the multiplexer 208. The write pointer generator 220 and the read pointer generator 222 are each coupled to the FIFO component 224. The FIFO data storage structure 230 (e.g., each of its elements FIFO[0] through FIFO[3]) is coupled to the multiplexer 232, such that the multiplexer 232 can output data from the FIFO data storage structure 230 based on the read pointer signal. The flip-flops 206A, 206B are each coupled to the multiplexer 232 and the multiplexer 208. The flip-flop 206A receives a write clock signal (CLK_WR), and the flip-flop 206B receives an inverted version of the write clock signal. The FIFO component 224 is coupled to a component that provides the FIFO component 224 with input data (via a data input (IN) of the FIFO component 224) that is to be written to a memory by way of the write data path 200.

During operation, the DDL component 202 can receive the input clock signal and generate the write clock signal based on the input clock signal. In particular, the DDL component 202 can generate the write clock signal by delaying the input clock signal according to one or more settings of the DDL component 202, which can include one or more delay values provided to the write data path 200. The write pointer generator 220 can generate the write pointer signal based on the input clock signal, and the read pointer generator 222 can generate the read pointer signal based on the write clock signal. For some embodiments, the write pointer signal identifies a current element (e.g., indicates a current index) of the FIFO data storage structure 230 that is to receive and store input data received via a data input (IN). For some embodiments (e.g., such as one for DDR memory), the input data can comprise a first data bit signal (WRITE_R) and a second data bit signal (WRITE_F) on the same edge of the input clock signal, where the first data bit signal (WRITE_R) will eventually be output on a rising edge of the write clock signal and the second data bit signal (WRITE_F) will eventually be output on a falling edge of the write clock signal. For some embodiments, the read pointer signal identifies a current element (e.g., indicates a current index) of the FIFO data storage structure 230 that is to provide stored data out of the FIFO component 224 via the multiplexer 232. Output data from the multiplexer 232 can comprise a first data bit signal (FIFO_R) to be received and stored by the flip-flop 206B on a falling edge of the write clock signal, and can comprise a second data bit signal (FIFO_F) to be received and stored by the flip-flop 206A on a rising edge of the write clock signal. Additionally, the multiplexer 208 can produce output data (WR) that comprises data provided by the flip-flop 206B when the write clock signal represents a high signal (e.g., value representing 1), and that comprises data provided by the flip-flop 206A when the write clock signal represents a low signal (e.g., value representing 0). For some embodiments, the output data (WR) from the multiplexer 208 can comprise a serialized data bit stream to be written to memory (e.g., DDR memory).

Referring now to FIG. 3, the write data path 300 represents a write data path that includes a clock stop gate component for stopping a clock signal from being received by a digital delay line component in accordance with various embodiments described herein. Like the write data path 200 of FIG. 2, the write data path 300 comprises a digital delay line (DDL) component 302, a FIFO mechanism 304, flip-flops 306A, 306B, and a multiplexer 308, where the FIFO mechanism 304 comprises a write pointer generator (WPTR GEN) 320, a read pointer generator (RPTR GEN) 322, and a first-in-first-out (FIFO) component 324. The FIFO component 324 comprises a first-in-first-out (FIFO) data storage structure 330 that couples to a multiplexer 332 that outputs data from the FIFO data storage structure 330 to each of the flip-flops 306A, 306B. Additionally, the write data path 300 comprises a clock-gate 340, and a digital delay line (DDL) setting component 348.

As shown, the clock gate (CG) 340, the write pointer generator 320, the DDL settings component 348, and the FIFO component 324 are each coupled to a component that provides an input clock signal (CLK). The clock gate 340 is coupled to the DDL component 302 to provide the DDL component 302 with a gated clock signal (CLK_GATED), The DDL component 302 is coupled to the DDL settings component 348, the read pointer generator 322, and the multiplexers 306A, 306B, 308. The DDL component 302 provides each of the read pointer generator 322, the multiplexer 306A, the multiplexer 306B, and the multiplexer 308 with a write clock signal (CLK_WR). The DDL settings component 348 is coupled to the DDL, component 302 to provide the DDL component 302 with settings information, such as one or more delay values. The DDL settings component 348 can be coupled to a component that provides a digital delay line encode signal, which can determine the settings information provided to the DDL component 302. The write pointer generator 320 and the read pointer generator 322 are each coupled to the FIFO component 324. The write pointer generator 320 is also coupled to the read pointer generator 322 to provide the read pointer generator 322 with the write pointer signal (e.g., for write pointer signal/read point signal synchronization purposes). The read pointer generator 322 is coupled to and receives a pointer synchronization signal (PTR_SYNC) that can enable the read pointer generator 322 to receive the write pointer signal (WPTR_SYNC) from the write pointer generator 320 during write pointer signal/read pointer signal synchronization. The read pointer generator 322 is coupled to the DDL component 302 to receive the write clock signal (CLK_WR). The FIFO data storage structure 330 (e.g., each of its elements FIFO[0] through FIFO[3]) is coupled to the multiplexer 332, such that the multiplexer 332 can output data from the FIFO data storage structure 330 based on the read pointer signal. For some embodiments, the FIFO data storage structure 330 provides a 4-deep FIFO. For some embodiments, this can enable the write data path 300 to increase setup time and hold time of the write path 300 by a margin of 2.5 tCK (based on a 4-deep FIFO, maximum DDL delay of 1 tCK, minimum delay of 0 tCK, and both rising and falling edge sampling), lower linear digital delay line latency with respect to delay setting (e.g., tDL—delay setting of DDL, in % of tCK). The FIFO component 324 is coupled to a component that provides the FIFO component 324 with input data (via a data input (IN) of the FIFO component 324) that is to be written to a memory by way of the write data path 300. The flip-flop 306A receives a write clock signal (CLK_WR) from the DDL component 302, while the flip-flop 306B receives an inverted version of the write clock signal from the DDL component 302. The flip-flop 306A is coupled to (and outputs to) the multiplexer 308, and the flip-flop 306B is coupled to (and outputs to) the multiplexer 308.

During operation, the DDL component 302 can receive the gated clock signal from the clock gate 340 and generate the write clock signal based on the gated clock signal. In particular, the DDL component 302 can generate the write clock signal by delaying the gated clock signal according to one or more settings of the DDL component 302, which can be provided by the DDL settings component 348. The write pointer generator 320 can generate the write pointer signal (WPTR) based on the input clock signal, and the read pointer generator 322 can generate the read pointer signal (RPTR) based on the write clock signal. For some embodiments, the write pointer signal identifies a current element (e.g., indicates a current index) of the FIFO data storage structure 330 that is to receive and store input data received via a data input (IN). For some embodiments (e.g., such as one for DDR memory), the input data can comprise a first data bit signal (WRITE_R) and a second data bit signal (WRITE_F) on the same edge of the input clock signal, where the first data bit signal (WRITE_R) will eventually be output on a rising edge of the write clock signal and the second data bit signal (WRITE_F) will eventually be output on a falling edge of the write clock signal. For some embodiments, the read pointer signal identifies a current element (e.g., indicates a current index) of the FIFO data storage structure 330 that is to provide stored data out of the FIFO component 324 via the multiplexer 332. Output data from the multiplexer 332 can comprise a first data bit signal (FIFO_R) to be received and stored by the flip-flop 306B on a falling edge of the write clock signal, and can comprise a second data bit signal (FIFO_F) to be received and stored by the flip-flop 306A on a rising edge of the write clock signal.

As shown, a clock enable signal (CLK_EN) is received by the clock gate 340 and controls clock gating within the write data path 300. Depending on the embodiment, a clock enable signal (CLK_EN) can be set to low (e.g., value representing 0) to facilitate synchronization of the write pointer signal and the read pointer signal (generated by the write pointer generator 320 and the read pointer generator 322 respectively), to facilitate update of the digital delay line (DDL) settings (by programming the DDL settings component 348 via the digital delay line encode signal), or both. For instance, to update the DDL settings, the gated clock signal (CLK_GATED) can be stopped for at least one clock cycle by de-asserting the clock enable signal (CLK_EN) for the at least one clock cycle, can program the DDL, settings component 348 (e.g., update from a first delay value to a second delay value or perform a rank switch via a digital delay line encoding signal) during the clock stoppage, and can subsequently resume clock cycles by re-asserting the clock enable signal (CLK_EN) after the at least one clock cycle. In this way, glitches on the clock write signal (CLK_WR) can be avoided and glitch-less delay line switching can be achieved. As another example, to synchronize the write pointer signal and the read pointer signal, the gated clock signal (CLK_GATED) can be stopped for at least one clock cycle by de-asserting the clock enable signal (CLK_EN) for the at least one clock cycle, can use the pointer synchronization signal (PTR_SYNC) to cause the read pointer generator 322 to synchronize the read pointer signal it outputs with the write pointer signal (WPTR_SYNC) outputted by the write pointer generator 320, and can subsequently resume clock cycles by re-asserting the clock enable signal (CLK_EN) after the at least one clock cycle. During the synchronization, the input clock signal (CLK) represents a pre-digital delay line clock signal that enables the write pointer generator 320 to transfer its write pointer value to the read pointer generator 322. Accordingly, to synchronize the write pointer signal and the read pointer signal or to update the DDL settings via a digital delay line encode signal, the clock enable signal (CLK_EN) can be set to low (e.g., value representing 0) for at least one clock cycle of the input clock signal (CLK).

For some embodiments, through a digital delay line encoding signal, a digital delay line switch sequence can be performed, which can reduce a rank-to-rank switch time (e.g., to 5 times tCK), The sequence can comprise transfer of a last bit through the data input (IN) with the digital delay line programmed with a first delay value (e.g., value of 'x'). Using the clock enable signal (CLK_EN), the gated clock signal (CLK_GATED) into the DDL component 302 can be stopped for at least one clock cycle (e.g., two clock cycles). This can obviate the need to disable an I/O pad to execute this rank-to-rank switch. Then, the digital delay line switch can be performed on the one or more (e.g., two edges) of the stopped input clock signal. After the at least one clock cycle, the gated clock signal (CLK_GATED) can resume and be received by the DDL component 302, and the write data path 300 is ready for new data bit transfers (via the data input (IN)) using a second delay value (e.g., new value of 'y').

Eventually, the multiplexer 308 can produce output data (WR) that comprises data provided by the flip-flop 306B, when the write clock signal represents a high signal (e.g., value of 1), and that comprises data provided by the flip-flop 306A when the write clock signal represents a low signal (e.g., value of 0). For some embodiments, the output data (WR) from the multiplexer 308 can comprise a serialized data bit stream to be written to memory (e.g., DDR memory).

For circuit design purposes, the write data path 200 of FIG. 2 or the write data path 300 of FIG. 3 can be added to a circuit design, which can comprise a memory.

Referring now to FIG. 4, the write data path 400 represents a write data path that includes a clock stop gate component for stopping a clock signal from being received by a digital delay line component in accordance with various embodiments described herein. Like the write data path 300 of FIG. 3, the write data path 400 comprises a digital delay line (DDL) component 402, a FIFO mechanism 404, flip-ops 406A, 406B, a multiplexer 408, a clock-gate 440, and a digital delay line (DDL) setting component 448. The FIFO mechanism 404 comprises a write pointer generator (WPTR GEN) 420, a read pointer generator (RPTR GEN) 422, and a first-in-first-out (FIFO) component 424. The FIFO component 424 comprises a first-in-first-out (FIFO) data storage structure 430 that couples to a multiplexer 432 that outputs data from the FIFO data storage structure 430 to each of the flip-flops 406A, 406B.

For some embodiments, the write data path 400 is similar to the write data path 300 of FIG. 3 except for absence of a pointer synchronization signal (PTR_SYNC), a write pointer signal (WPTR_SYNC) between the write pointer generator 420 to the read pointer generator 422, and the write pointer generator 420 operates based on the gated clock signal (CLFigures 5aK_GATED) (rather than the clock enable signal (CLK_EN) and the input clock signal (CLK)). Unlike the write data path 300 of FIG. 3, the write data path 400 does not use a pointer synchronization signal (PTR_SYNC) or a write pointer signal (WPTR_SYNC) from the write pointer generator 420 to the read pointer generator 422 to facilitate the synchronization of the write pointer signal and the read pointer signal. Rather, as shown, the write pointer generator 420 receives the gated clock signal (CLK_GATED) from the clock gate 440 and the read pointer generator 422 receives a clock write signal (CLK_WR) from the DDL component 402. In doing so, the write data path 400 can ensure synchronization between the write pointer signal and the read pointer signal by applying the same clock pulses to the write pointer generator 420 and to the read pointer generator 422.

Figure 5A:
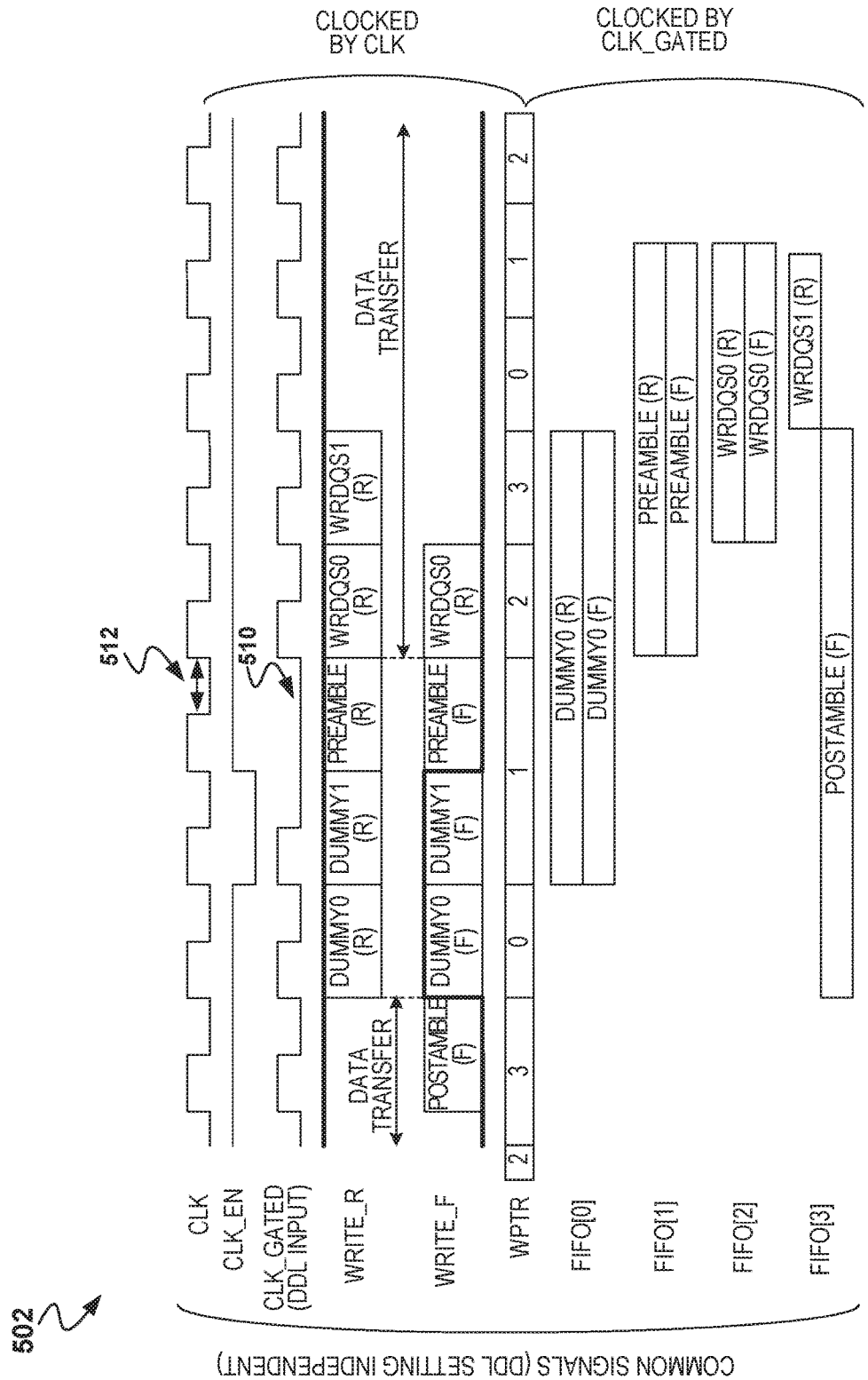
FIGS. 5A through 5C are diagrams illustrating example signals for an example write data path, in accordance with various embodiments.
Figure 5B:
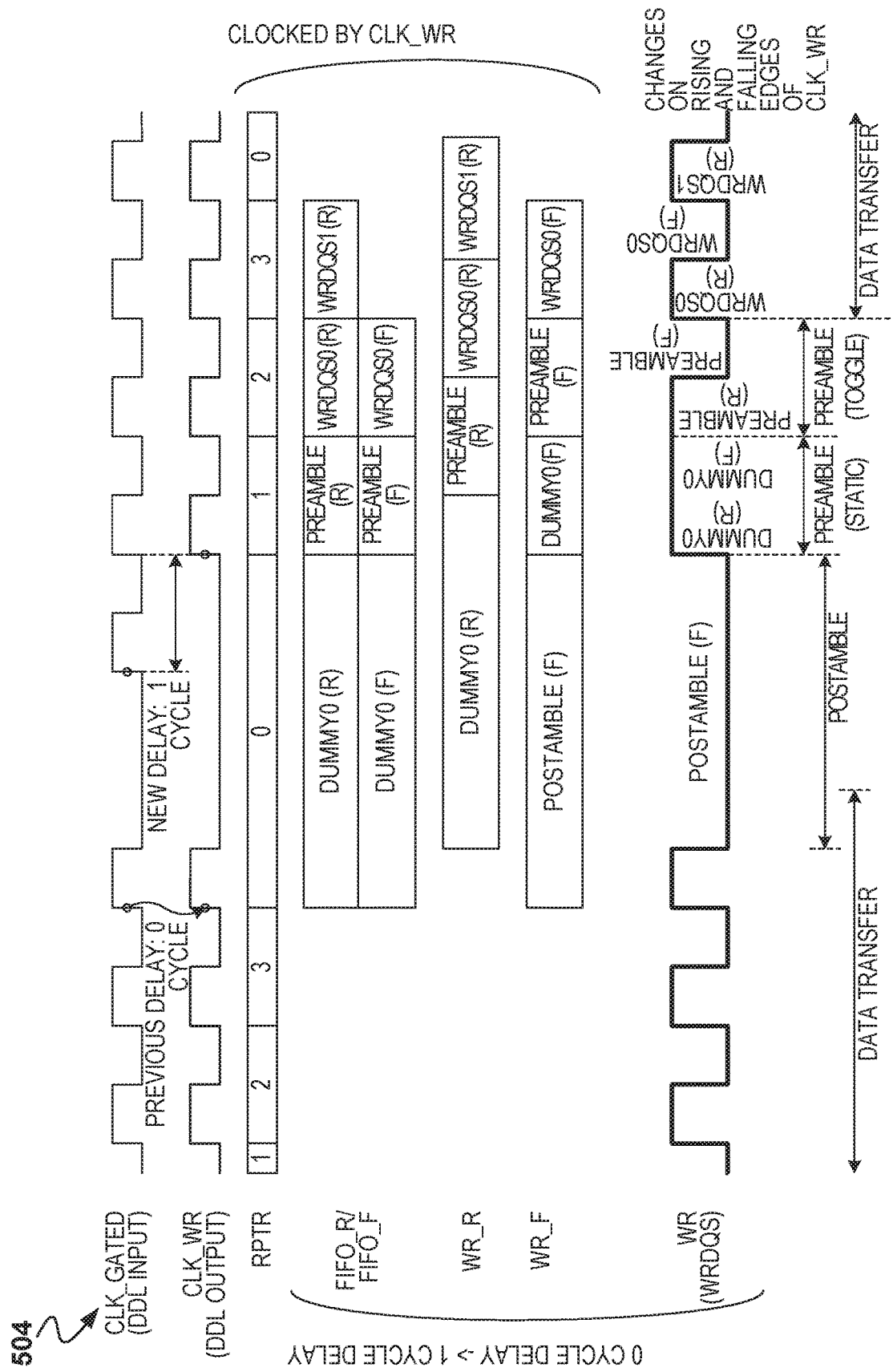
Figure 5C:
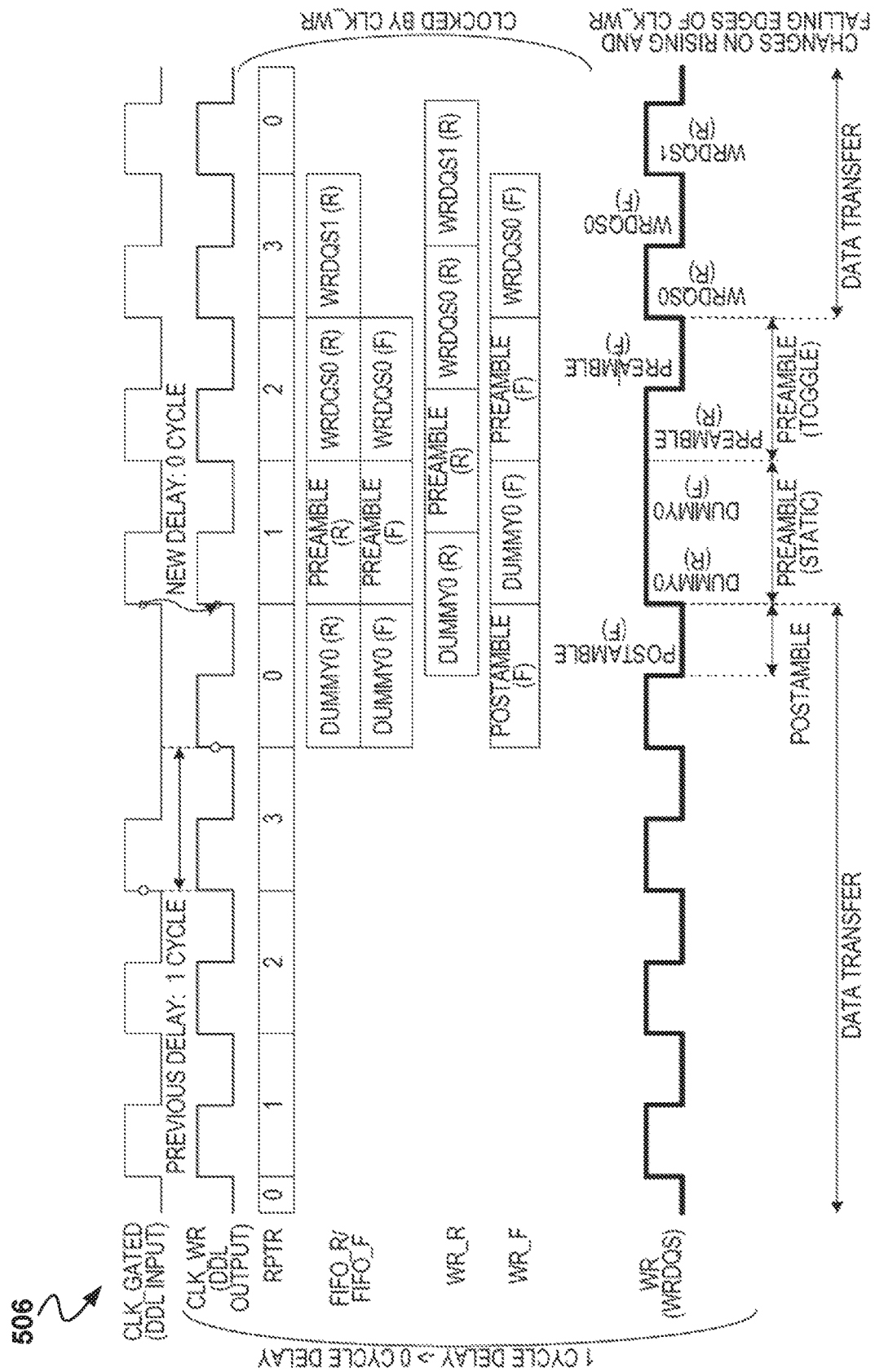

FIGS. 5A through 5C are diagrams illustrating example signals for the write data path 400 of FIG. 4, in accordance with various embodiments. In particular, FIG. 5A illustrates the input clock signal (CLK), the clock enable signal (CLK_EN), the gated clock signal (CLK_GATED) (which serves as input to the DDL component 402), the first data bit signal (WRITE_R), the second data bit signal (WRITE_F), the write pointer signal (WPTR), and output of the FIFO elements [0] through [3]. As noted, the clock enable signal (CLK_EN), the first data bit signal (WRITE_R), and the second data bit signal (WRITE_F), while the write pointer signal (WPTR) and the outputs of the FIFO elements [0] through [3] are clocked by the gated clock signal (CLK_GATED). Reference 510 refers to where the gated clock signal (CLK_GATED) is stopped for one clock cycle based the clock enable signal (CLK_EN) being set to low (e.g., de-asserted) for one clock cycle Reference 512 refers where, for some embodiments, a DDL setting change can be performed.

FIG. 5B illustrates the write path 400 going from a 0 clock cycle delay to a 1 clock cycle delay. In FIG. 5B, the gated clock signal (CLK_GATED), the write clock signal (CLK_WR), the read pointer signal (RPTR), output of the FIFO component 424 (FIFO_R/FIFO_F), outputs of the flip-flops 406A, 406B (WR_F/WR_R), and output of the multiplexer 408 (WR) are shown. As noted, the read pointer signal (RPTR), output FIFO_R/FIFO_F, and outputs WR_F/WR_R are clocked by the write clock signal (CLK_WR). As shown, based on a change to the setting of the DDL component 402 (e.g., switching the delay value from 0 to 1 during the clock stoppage illustrated in FIG. 5A), the output of the gated clock signal (CLK_GATED) eventually results in 1 clock delay between the gated clock signal and the write clock signal (CLK_WR).

FIG. 5C illustrates the write path 400 going from a 1 clock cycle delay to a 0 clock cycle delay. Like FIG. 5B, FIG. 5C illustrates the gated clock signal (CLK_GATED), the write clock signal (CLK_WR), the read pointer signal (RPTR), output of the FIFO component 424 (FIFO_R/FIFO_F), outputs of the flip-flops 406A, 406B (WR_F/WR_R), and output of the multiplexer 408 (WR) are shown. As shown, based on a change to the setting of the DDL component 402 (e.g., switching the delay value from 1 to 0 during the clock stoppage illustrated in FIG. 5A), the of the gated clock signal (CLK_GATED) eventually results in 0 clock delay between the gated clock signal and the write clock signal (CLK_WR).

Figure 6:
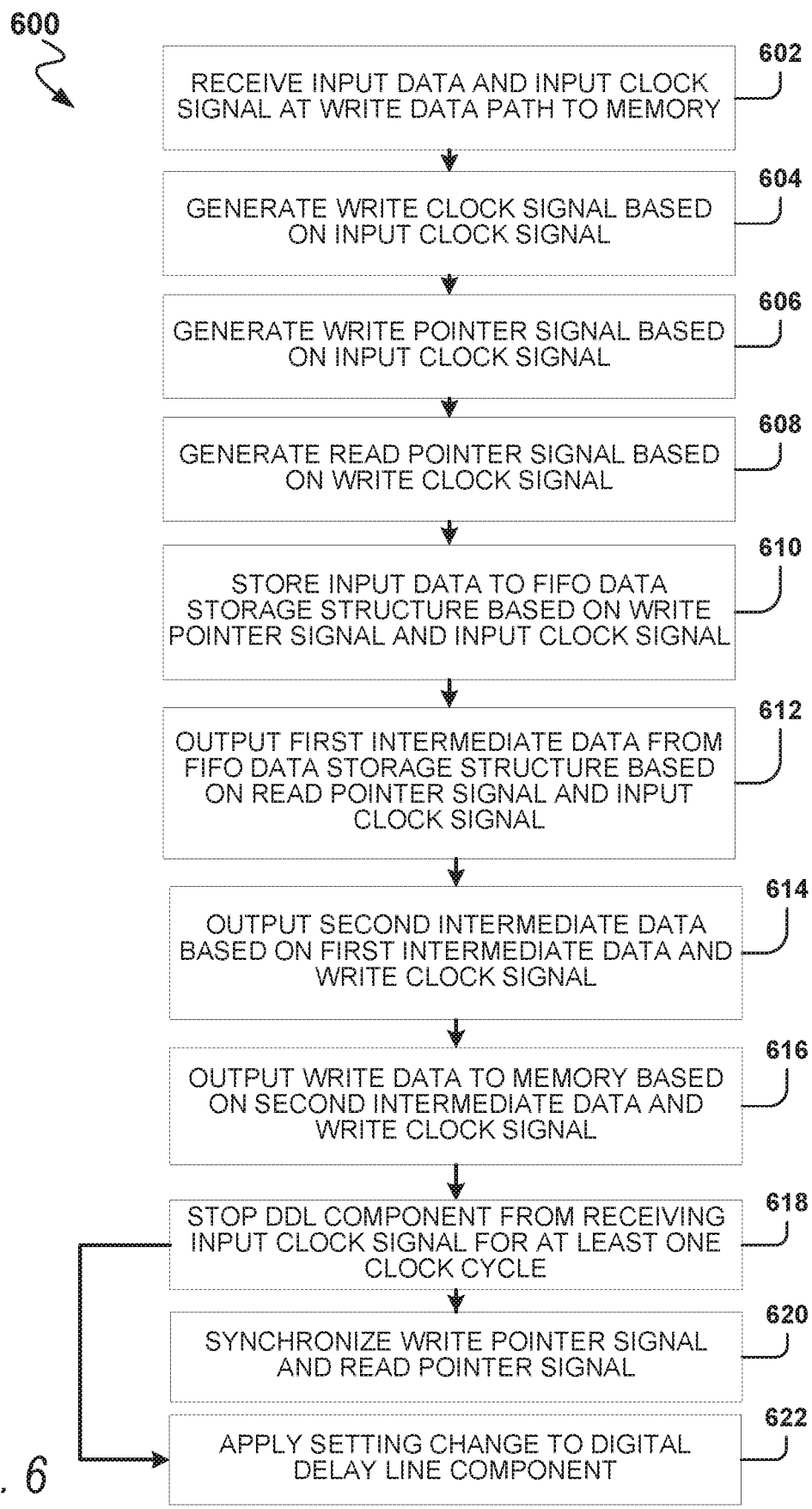
FIG. 6 is a flowchart illustrating an example method for a write data path coupled to a memory, in accordance with various embodiments.

FIG. 6 is a flowchart illustrating an example method 600 for a write data path coupled to a memory, in accordance with various embodiments. For some embodiments, at least some portion of the method 600 is performed by a write data path similar to the write data path described herein, such as the write data path 200 of FIG. 2 or the write data path 300 of FIG. 3. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

Referring now to FIG. 6, at operation 602, a write data path receives input data (e.g., WRITE_R/WRITE_F via data input) and an input clock signal (e.g., CLK) at a write data path (e.g., 300) coupled to a memory. According to some embodiments, the write data path comprises a digital delay line component (e.g., 302), a write pointer generator (e.g., 320), a read pointer generator (e.g., 322), a first-in-first-out component 324) that implements a first-in-first-out data storage structure (e.g., 330), a plurality of flip-flops (e.g., 306A, 306B), and a multiplexer (e.g., 308). Continuing with operation 604, the digital delay line component of the write data path generates a write clock signal (e.g., CLK_WR) based on the input clock signal (e.g., CLK_GATED that is generated from CLK). At operation 606, the write pointer generator of the write data path generates a write pointer signal (e.g., WPTR) based on the input clock signal (e.g., CLK). At operation 608, the read pointer generator generates a read pointer signal (e.g., RPTR) based on the write clock signal (e.g., CLK_WR).

At operation 610, the first-in-first-out component of the write data path stores the input data to the first-in-first-out data storage structure (e.g., 330) based on the write pointer signal (e.g., WPTR) and the input clock signal (e.g., CLK). Additionally, at operation 612, the first-in-first-out component outputs first intermediate data (e.g., FIFO_F/FIFO_R via the multiplexer 332) from the first-in-first-out data storage structure (e.g., 330) based on the read pointer signal (e.g., RPTR) and the input clock signal (e.g., CLK).

The plurality of flip-flops (e.g., 306A, 306B) can receive the first intermediate data from the first-in-first-out component. At operation 614, the plurality of flip-flops (e.g., 306A, 306B) output second intermediate data (e.g., Q output of the flip-flops 306A and 306B) based on the first intermediate data (e.g., FIFO_F/FIFO_R from the multiplexer 332) and the write clock signal (e.g., CLK_WR). Eventually, the second intermediate data from the plurality of flip-flops (e.g., 306A, 306B) reach the multiplexer (e.g., 308) of the write data path. At operation 616, the multiplexer (e.g., 308) outputs write data (e.g., serialized data bit stream) to be written to the memory based on the second intermediate data (e.g., Q output of the flip-flops 306A and 306B) and the write clock signal (e.g., CLK_WR from the DDL component 302).

At operation 618, a clock gate component (e.g., 340) of the write data path can stop the input clock signal (e.g., CLK) from being received (e.g., as CLK_GATED) by the digital delay line (DDL) component (e.g., 302) for at least one clock cycle, thereby stopping generation of the write clock signal (e.g., CLK_WR) by the DDL component (e.g., 302). During the at least one clock cycle, operation 620, operation 622, or both can be performed. At operation 620, the write pointer signal (e.g., WPTR) and the read pointer signal RPTR) are synchronized. For some embodiments, this involves the write pointer generator (e.g., 302) transferring the write pointer signal (e.g., write pointer value) to the read pointer generator (e.g., 322) while the write pointer generator operates on the input clock signal (e.g., CLK) and the read pointer generator operates on the write clock signal (CLK_WR). At operation 622, a setting change is applied to the DDL component (e.g., 302). For some embodiments, this involves a DDL settings component (e.g., 348) causing the setting change to the DDL component, which in turn can cause the DDL component to switch from a first (current) delay value to a second (new) delay value. By way of operations 618 and 622, various embodiments can achieve glitch-less switching of digital delay line (from one delay value to another) and can reduce having to halt data transfer to implement a digital delay line change.

Figure 7:
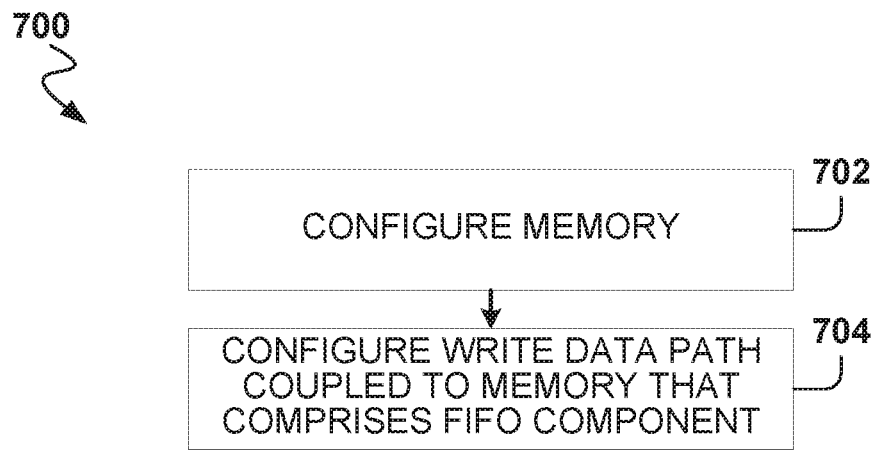
FIG. 7 is a flowchart illustrating an example method for generating a circuit design including an example write data path coupled to a memory, in accordance with various embodiments.

FIG. 7 is a flowchart illustrating an example method 700 for generating a circuit design including an example write data path coupled to a memory, in accordance with various embodiments. It will be understood that the method 700 may be performed by a device, such as a computing device executing instructions of an electronic design automation (EDA) software system, in accordance with some embodiments. Additionally, the method 700 herein may be implemented in the form of executable instructions stored on a computer-readable medium or in the form of electronic circuitry. For instance, the operations of the method 700 may be represented by executable instructions that, when executed by a processor of a computing device, cause the computing device to perform the method 700.

Referring now to FIG. 7, at operation 702, memory is configured within a circuit design. For some embodiments, the memory comprises a dual-data rate (UDR) memory, such as DDR3, DDR4, DDR5, LPDDR3, LPDDR4, and LPDDR5 memory. At operation 704, a write data path is configured within the circuit design to couple to the memory, where the write data path comprises a first-in-first-out component as described herein. According to various embodiments, the write data path comprises a digital delay line (DDL) component, a write pointer generator, a read pointer generator, the first-in-first-out component, a plurality of flip-flops, and a multiplexer as described herein. For example, the write data path configured by operation 704, the write data path comprises: a digital delay line (DDL) component that receives an input clock signal and generates a write clock signal based on the input clock signal; a write pointer generator that receives the input clock signal and generates a write pointer signal based on the input clock signal; a read pointer generator that receives the write clock signal and generates a read pointer signal based on the write clock signal; a first-in-first-out component that implements a first-in-first-out data storage structure; a plurality of flip-flops that receive the write clock signal, receive first intermediate data from the first-in-first-out component, and output second intermediate data based on the first intermediate data and the write clock signal; and a multiplexer that receives the second intermediate data from the plurality of flip-flops, receives the write clock signal, and outputs write data to be written to the memory based on the second intermediate data and the write clock signal. The first-infirst-out component can receive the input clock signal, the write pointer signal, the read pointer signal, and input data to be written to the memory. The first-in-first-out component can store the input data to the first-in-first-out data storage structure based on the write pointer signal and the input clock signal, and can output the first intermediate data from the first-in-first-out data storage structure based on the read pointer signal and the input clock signal.

The write data path configured by operation 704 can further comprise a clock gate component as described herein. The clock gate component can stop the input clock signal from being received by the digital delay line component during at least one of application of a setting change to the digital delay line component or synchronization of the write pointer signal and the read pointer signal. Additionally, the clock gate component can stop the input clock signal from being received by the digital delay line component during application of a setting change to the digital delay line component. The application of the setting change can comprise causing the clock gate component to stop the input clock signal from being received by the digital delay line component for at least one clock cycle, and during the at least one clock cycle, causing (e.g., via a DDL settings component) the digital delay line component to switch from the first delay value to a second delay value.

Figure 8:
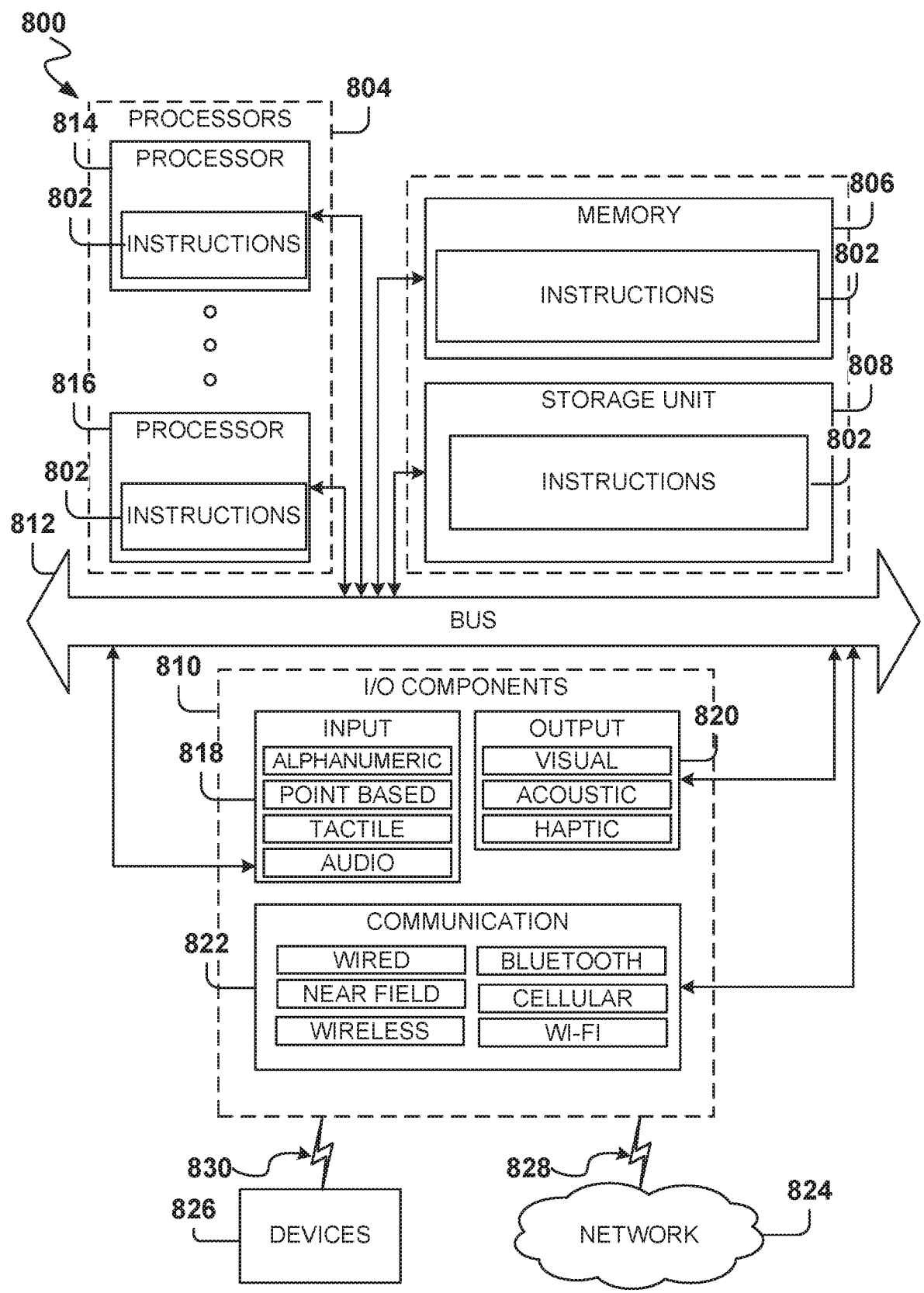
FIG. 8 is a block diagram illustrating components of a machine, according to some example embodiments, able to read instructions from a machine-readable medium and perform any one or more of the methodologies discussed herein.

FIG. 8 is a block diagram illustrating components of a machine 800, according to some example embodiments, able to read instructions from a machine-readable medium (e.g., a machine-readable storage medium) and perform any one or more of the methodologies discussed herein. Specifically, FIG. 8 shows a diagrammatic representation of the machine 800 in the example form of a system, within which instructions 802 (e.g., software, a program, an application, an applet, an app, a driver, or other executable code) for causing the machine 800 to perform any one or more of the methodologies discussed herein may be executed. For example, the instructions 802 include executable code that causes the machine 800 to execute the method 600. In this way, these instructions 802 transform the general, non-programmed machine 800 into a particular machine programmed to carry out the described and illustrated method 600 in the manner described herein. The machine 800 may operate as a standalone device or may be coupled (e.g., networked) to other machines.

By way of non-limiting example, the machine 800 may comprise or correspond to a computer (e.g., a server computer, a client computer, a personal computer (PC), a tablet computer, a laptop computer, or a netbook), a smart phone, a mobile device, or any machine capable of executing the instructions 802, sequentially or otherwise, that specify actions to be taken by the machine 800. Further, while only a single machine 800 is illustrated, the term "machine" shall also be taken to include a collection of machines 800 that individually or jointly execute the instructions 802 to perform any one or more of the methodologies discussed herein.

The machine 800 may include processors 804, memory 806, a storage unit 808, and I/O components 810, which may be configured to communicate with each other such as via a bus 812. In an example embodiment, the processors 804 (e.g., a central processing unit (CPU), a reduced instruction set computing (RISC) processor, a complex instruction set computing (CISC) processor, a graphics processing unit (CPU), a digital signal processor (DSP), an application specific integrated circuit (ASIC), a radio-frequency integrated circuit (RFIC), another processor, or any suitable combination thereof) may include, for example, a processor 814 and a processor 816 that may execute the instructions 802. The term "processor" is intended to include multi-core processors 804 that may comprise two or more independent processors (sometimes referred to as "cores") that may execute instructions 802 contemporaneously. Although FIG. 8 shows multiple processors 804, the machine 800 may include a single processor with a single core, a single processor with multiple cores (e.g., a multi-core processor), multiple processors with a single core, multiple processors with multiple cores, or any combination thereof.

The memory 806 (e.g., a main memory or other memory storage) and the storage unit 808 are both accessible to the processors 804 such as via the bus 812. The memory 806 and the storage unit 808 store the instructions 802 embodying any one or more of the methodologies or functions described herein. The instructions 802 may also reside, completely or partially, within the memory 806, within the storage unit 808, within at least one of the processors 804 (e.g., within the processor's cache memory), or any suitable combination thereof, during execution thereof by the machine 800. Accordingly, the memory 806, the storage unit 808, and the memory of the processors 804 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 802. The term "machine-readable medium" shall also be taken to include any medium, or combination of multiple media, that is capable of storing instructions (e.g., instructions 802) for execution by a machine (e.g., machine 800), such that the instructions, when executed by one or more processors of the machine (e.g., processors 804), cause the machine to perform any one or more of the methodologies described herein (e.g., method 600). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 810 may include a wide variety of components to receive input, provide output, produce output, transmit information, exchange information, capture measurements, and so on. The specific I/O components 810 that are included in a particular machine 800 will depend on the type of the machine 800. For example, portable machines such as mobile phones will likely include a touch input device or other such input mechanisms, while a headless server machine will likely not include such a touch input device. It will be appreciated that the I/O components 810 may include many other components that are not specifically shown in FIG. 8. The I/O components 810 are grouped according to functionality merely for simplifying the following discussion and the grouping is in no way limiting. In various example embodiments, the I/O components 810 may include input components 818 and output components 820. The input components 818 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 820 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 810 may include communication components 822 operable to couple the machine 800 to a network 824 or devices 826 via a coupling 828 and a coupling 830 respectively. For example, the communication components 822 may include a network interface component or another suitable device to interface with the network 824. In further examples, the communication components 822 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 826 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 9:
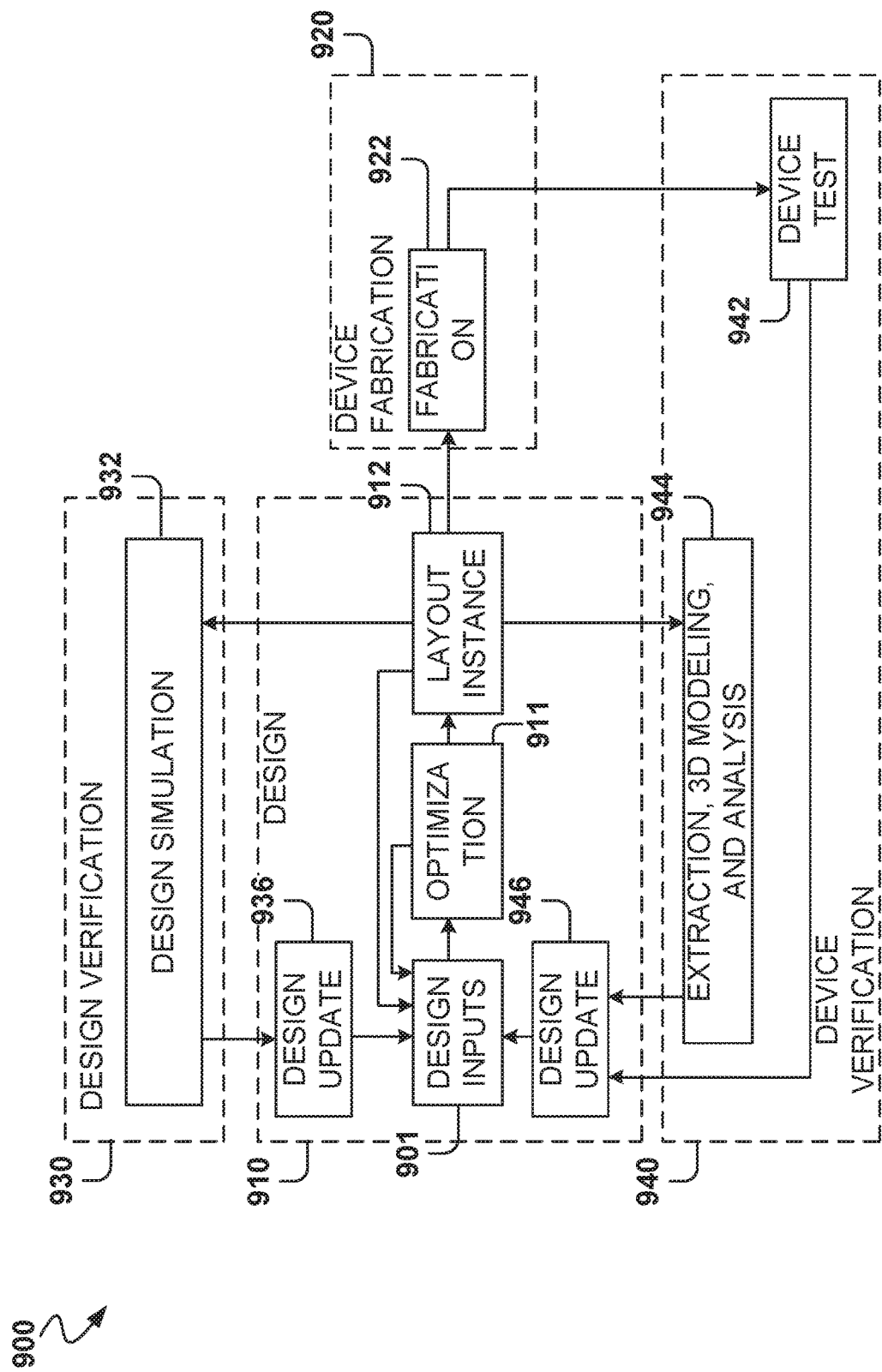
FIG. 9 is a diagram illustrating one possible design process flow for generating a circuit, including embodiments to implement a write data path to memory as described herein, and in various embodiments, to integrate the write data path with a larger integrated circuit comprising different design blocks.

FIG. 9 is a diagram illustrating one possible design process flow for generating a circuit, including embodiments to implement a write data path to memory as described herein, and in various embodiments, to integrate the write data path with a larger integrated circuit comprising different design blocks. As illustrated, the overall design flow 900 includes a design phase 910, a device fabrication phase 920, a design verification phase 930, and a device verification phase 940. The design phase 910 involves an initial design input operation 901 where the basic elements and functionality of a device are determined, as well as revisions based on various analyses and optimization of a circuit design. This design input operation 901 is where instances of an EDA circuit design file are used in the design and any additional circuitry is selected. The initial strategy, tactics, and context for the device to be created are also generated in the design input operation 901, depending on the particular design algorithm to be used.

In some embodiments, following an initial selection of design values in the design input operation 901, timing analysis and optimization according to various embodiments occurs in an optimization operation 911, along with any other automated design processes. One such process may be the automated design of a partitioned root search for error locator polynomial functions in RS FEC decoding. As described below, design constraints for blocks of a circuit design generated with design inputs in the design input operation 901 may be analyzed using hierarchical timing analysis, according to various embodiments. While the design flow 900 shows such optimization occurring prior to a layout instance 912, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 922.

After design inputs are used in the design input operation 901 to generate a circuit layout, and any optimization operations 911 are performed, a layout is generated in the layout instance 912. The layout describes the physical layout dimensions of the device that match the design inputs. This layout may then be used in the device fabrication operation 922 to generate a device, or additional testing and design updates may be performed using designer inputs or automated updates based on design simulation 932 operations or extraction, 3D modeling, and analysis 944 operations. Once the device is generated, the device can be tested as part of device test 942 operations, and layout modifications generated based on actual device performance.

As described in more detail below, design updates 936 from the design simulation 932, design updates 946 from the device test 942, the 3D modeling and analysis 944 operations, or the design input operation 901 may occur after an initial layout instance 912 is generated. In various embodiments, whenever design inputs are used to update or change an aspect of a circuit design, a timing analysis and optimization operation 911 may be performed.

For example, in various embodiments, a user may provide an input to a computing device indicating placement of elements of a circuit within a first portion of a circuit design, including description of circuitry for a write data path to memory described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
    memory for storing data; and
    a write data path coupled to the memory, the write data path comprising:
        a digital delay line component that receives an input clock signal and generates a write clock signal based on the input clock signal;
        a write pointer generator that receives the input clock signal and generates a write pointer signal based on the input clock signal;
        a read pointer generator that receives the write clock signal and generates a read pointer signal based on the write clock signal;
        a first-in-first-out component that implements a first-in-first-out data storage structure, the first-in-first-out component receiving the input clock signal, the write pointer signal, the read pointer signal, and input data to be written to the memory, the first-in-first-out component storing the input data to the first-in-first-out data storage structure based on the write pointer signal and the input clock signal, and the first-in-first-out component outputting first intermediate data from the first-in-first-out data storage structure based on the read pointer signal and the input clock signal;
        a plurality of flip-flops that receive the write clock signal, receive the first intermediate data from the first-in-first-out component, and output second intermediate data based on the first intermediate data and the write clock signal; and
        a multiplexer that receives the second intermediate data from the plurality of flip-flops, receives the write clock signal, and outputs write data to be written to the memory based on the second intermediate data and the write clock signal.

2. The circuit of claim 1, wherein the first-in-first-out component is to receive the input data at least twice per a clock cycle.

3. The circuit of claim 1, wherein the input data comprises two bits of data per a clock cycle.

4. The circuit of claim 1, wherein the input data is provided by a DQ signal.

5. The circuit of claim 1, wherein the write data comprises a serialized data hit stream.

6. The circuit of claim 1, wherein the memory receives the write data at a dual-data rate.

7. The circuit of claim 1, wherein the input clock signal is received from a physical layer.

8. The circuit of claim 1, wherein the write data path further comprises:
    a clock gate component to stop the input clock signal from being received by the digital delay line component during at least one of application of a setting change to the digital delay line component or synchronization of the write pointer signal and the read pointer signal.

9. The circuit of claim 8, wherein the clock gate component stops the input clock signal for at least one clock cycle.

10. The circuit of claim 1, wherein the write data path further comprises:
    a clock gate component to stop the input clock signal from being received by the digital delay line component during synchronization of the write pointer signal and the read pointer signal, the synchronization of the write pointer signal and the read pointer signal comprising:
        causing the clock gate component to stop the input clock signal from being received by the digital delay line component for at least one clock cycles; and
        during the at least one dock cycle, causing the input clock signal to be sent to the read pointer generator, the read pointer generator generating the read pointer signal based on the input clock signal in absence of the write clock signal from the digital delay line component.

11. The circuit of claim 1, wherein the read pointer generator further receives the input clock signal, the write pointer signal and the read pointer signal being synchronized based on the input clock signal.

12. The circuit of claim 11, wherein the write pointer signal and the read pointer signal are synchronized based on the input clock signal in response to the write clock signal not being sent to the read pointer generator.

13. The circuit of claim 1, wherein the write data path further comprises:
a clock gate component to stop the input clock signal from being received by the digital delay line component during application of a setting change to the digital delay line component, the application of the setting change comprising:
causing the clock gate component to stop the input clock signal from being received by the digital delay line component for at least one clock cycle; and
during the at least one clock cycle, causing the digital delay line component to switch from a first delay value to a second delay value.

14. A method comprising:
receiving input data and an input clock signal at a write data path coupled to a memory, the write data path comprising a digital delay line component, a write pointer generator, a read pointer generator, a first-in-first-out component that implements a first-in-first-out data storage structure, a plurality of flip-flops, and a multiplexer;
generating, by the digital delay line component, a write clock signal based on the input clock signal;
generating, by the write pointer generator, a write pointer signal based on the input clock signal;
generating, by the read pointer generator, a read pointer signal based on the write clock signal;
storing, by the first-in-first-out component, the input data to the first-in-first-out data storage structure based on the write pointer signal and the input clock signal;
outputting, by the first-in-first-out component, first intermediate data from the first-in-first-out data storage structure based on the read pointer signal and the write clock signal;
outputting, by the plurality of flip-flops, second intermediate data based on the first intermediate data and the write clock signal; and
outputting, by the multiplexer, write data to be written to the memory based on the second intermediate data and the write clock signal.

15. The method of claim 14, wherein the write data path further comprises a clock gate component; the method further comprising:
stopping, by the clock gate component, the input clock signal from being received by the digital delay line component for at least one clock cycle during an application of a setting change to the digital delay line component, the setting change comprising a switch from a first delay value to a second delay value; and
during the at least one clock cycle; causing the digital delay line component to switch from the first delay value to the second delay value.

16. The method of claim 14, wherein the write data path further comprises a clock gate component, the method further comprising:
stopping, by the clock gate component, the input clock signal from being received by the digital delay line component for at least one clock cycle during synchronization of the write pointer signal and the read pointer signal; and
during the at least one clock cycle, causing the input clock signal to be sent to the read pointer generator, the synchronization of the write pointer signal and the read pointer signal comprising the read pointer generator generating the read pointer signal based on the input clock signal in absence of the write clock signal from the digital delay line component.

17. The method of claim 14, wherein the memory receives the write data at a dual-data rate.

18. A non-transitory computer-readable medium comprising instructions that, when executed by one or more processors of a computing device, cause the computing device to generate a circuit design by performing operations comprising:
configuring, in the circuit design, memory for storing data; and
configuring, in the circuit design, a write data path coupled to the memory, the write data path comprising:
a digital delay line component that receives an input clock signal and generates a write clock signal based on the input clock signal;
a write pointer generator that receives the input clock signal and generates a write pointer signal based on the input clock signal;
a read pointer generator that receives the write clock signal and generates a read pointer signal based on the write clock signal;
a first-in-first-out component that implements a first-in-first-out data storage structure, the first-in-first-out component receiving the input clock signal, the write pointer signal, the read pointer signal, and input data to be written to the memory, the first-in-first-out component storing the input data to the first-in-first-out data storage structure based on the write pointer signal and the input clock signal, and the first-in-first-out component outputting first intermediate data from the first-in-first-out data storage structure based on the read pointer signal and the write clock signal;
a plurality of flip-flops that receive the write clock signal, receive the first intermediate data from the first-in-first-out component, and output second intermediate data based on the first intermediate data and the write clock signal; and
a multiplexer that receives the second intermediate data from the plurality of flip-flops, receives the write clock signal, and outputs write data to be written to the memory based on the second intermediate data and the write clock signal.

19. The non-transitory computer-readable medium of claim 18, wherein the write data path further comprises:
a clock gate component to stop the input clock signal from being received by the digital delay line component during at least one of application of a setting change to the digital delay line component or synchronization of the write pointer signal and the read pointer signal.

20. The non-transitory computer-readable medium of claim 18, wherein the write data path further comprises:
a clock gate component to stop the input clock signal from being received by the digital delay line component during application of a setting change to the digital delay line component, the application of the setting change comprising:
causing the clock gate component to stop the input clock signal from being received by the digital delay line component for at least one clock cycle; and
during the at least one clock cycle, causing the digital delay line component to switch from a first delay value to a second delay value.

* * * * *